(12) United States Patent
Wong et al.

(10) Patent No.: US 12,744,523 B2
(45) Date of Patent: Sep. 22, 2026

(54) DRIVING CIRCUIT AND CONTROLLING METHOD FOR POWER TRANSISTOR

(71) Applicant: NATIONAL TSING HUA UNIVERSITY, Hsinchu (TW)

(72) Inventors: King-Yuen Wong, Hsinchu (TW); Shuo Hung Hsu, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 183 days.

(21) Appl. No.: 18/650,041

(22) Filed: Apr. 29, 2024

(65) Prior Publication Data

US 2025/0240014 A1 Jul. 24, 2025

(30) Foreign Application Priority Data

Jan. 19, 2024 (TW) ................................ 113102320

(51) Int. Cl.
*H03K 17/16* (2006.01)
*H03K 19/20* (2006.01)

(52) U.S. Cl.
CPC ........... *H03K 17/165* (2013.01); *H03K 19/20* (2013.01)

(58) Field of Classification Search
CPC ............................ H03K 17/165; H03K 19/20
See application file for complete search history.

(56) References Cited

U.S. PATENT DOCUMENTS

2007/0164815 A1 7/2007 Lee
2023/0006538 A1 1/2023 Zhou et al.
2025/0167780 A1* 5/2025 Nguyen ............... H03K 17/161

FOREIGN PATENT DOCUMENTS

KR 20190011494 A * 2/2019 ........... H03K 17/162
TW I798659 B 4/2023

* cited by examiner

*Primary Examiner* — Metasebia T Retebo
(74) *Attorney, Agent, or Firm* — CKC & Partners Co., LLC

(57) ABSTRACT

A driving circuit for a power transistor is proposed and includes a gate driving circuit, a controlling circuit and the power transistor. The gate driving circuit outputs a driving voltage signal and a pulse width modulation signal. The controlling circuit is coupled to the gate driving circuit and includes a voltage controller, a first transistor and a second transistor. The voltage controller outputs a controlling signal. The first transistor is turned on or off according to the pulse width modulation signal. The second transistor is turned on or off according to the pulse width modulation signal and the controlling signal. The power transistor coupled to the gate driving circuit and the controlling circuit is controlled by the driving voltage signal. When the first transistor is turned on or the first transistor and the second transistor are turned on, the driving voltage signal is pulled to a target voltage level.

17 Claims, 4 Drawing Sheets

DRIVING CIRCUIT AND CONTROLLING METHOD FOR POWER TRANSISTOR

RELATED APPLICATIONS

This application claims priority to Taiwan Application Serial Number 113102320, filed Jan. 19, 2024, which is herein incorporated by reference.

BACKGROUND

Technical Field

The present disclosure relates to a driving circuit and a controlling method for a semiconductor component. More particularly, the present disclosure relates to a driving circuit and a controlling method for a power transistor.

Description of Related Art

Power transistor is a metal-oxide-semiconductor field effect transistor (MOSFET) specially used to handle high-power voltage and current, and also a type of power semiconductor component. Compared with other power semiconductor components, power transistors have the advantages of fast switching speed and high efficiency at low voltage, but its disadvantage is that the switching power losses are large. In order to reduce high-frequency switching losses, the gate driving circuits in the prior separate the gate resistances into two paths, so that the power transistor has an on-state and an off-state. However, the gate driving circuit has significantly insufficient pull-up and pull-down capabilities for a gate terminal of the power transistor due to a lack of active devices. In view of this, a gate driving circuit and a controlling method that can reduce the switching power losses generated by the power transistor during switching are needed by the market and related industry.

SUMMARY

According to one aspect of the present disclosure, a driving circuit for a power transistor includes a gate driving circuit, a controlling circuit and the power transistor. The gate driving circuit is configured to output a driving voltage signal and a pulse width modulation signal. The controlling circuit includes a voltage controller, a first transistor and a second transistor. The voltage controller is configured to output a controlling signal. The first transistor is coupled to the gate driving circuit and selectively turned on or off according to the pulse width modulation signal. The second transistor is coupled to the gate driving circuit and the voltage controller, and is selectively turned on or off according to the pulse width modulation signal and the controlling signal. The power transistor is coupled to the gate driving circuit and the controlling circuit, and is controlled by the driving voltage signal. In response to determining that the first transistor is turned on or both the first transistor and the second transistor are turned on, the driving voltage signal is pulled to a target voltage level.

According to another aspect of the present disclosure, a driving circuit for a power transistor includes a gate driving circuit, a controlling circuit and the power transistor. The gate driving circuit is configured to output a driving voltage signal, a pulse width modulation signal and a controlling signal. The controlling circuit includes a first transistor and a second transistor. The first transistor is coupled to the gate driving circuit and selectively turned on or off according to the pulse width modulation signal. The second transistor is coupled to the gate driving circuit and selectively turned on or off according to the pulse width modulation signal and the controlling signal. The power transistor is coupled to the gate driving circuit and the controlling circuit, and is controlled by the driving voltage signal. In response to determining that the first transistor is turned on or both the first transistor and the second transistor are turned on, the driving voltage signal is pulled to a target voltage level.

According to yet another aspect of the present disclosure, a controlling method of a driving circuit for a power transistor includes performing a signal outputting step, a first transistor controlling step, a second transistor controlling step and a power transistor controlling step. The signal outputting step includes configuring a gate driving circuit to output a driving voltage signal and a pulse width modulation signal, and configuring one of the gate driving circuit and a voltage controller to output a controlling signal. The first transistor controlling step includes controlling a first transistor to selectively turn on or off according to the pulse width modulation signal. The second transistor controlling step includes controlling a second transistor to selectively turn on or off according to the pulse width modulation signal and the controlling signal. The power transistor controlling step includes controlling the power transistor according to the driving voltage signal. In response to determining that the first transistor is turned on or both the first transistor and the second transistor are turned on, the driving voltage signal is pulled to a target voltage level.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected" to another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Figure 1:
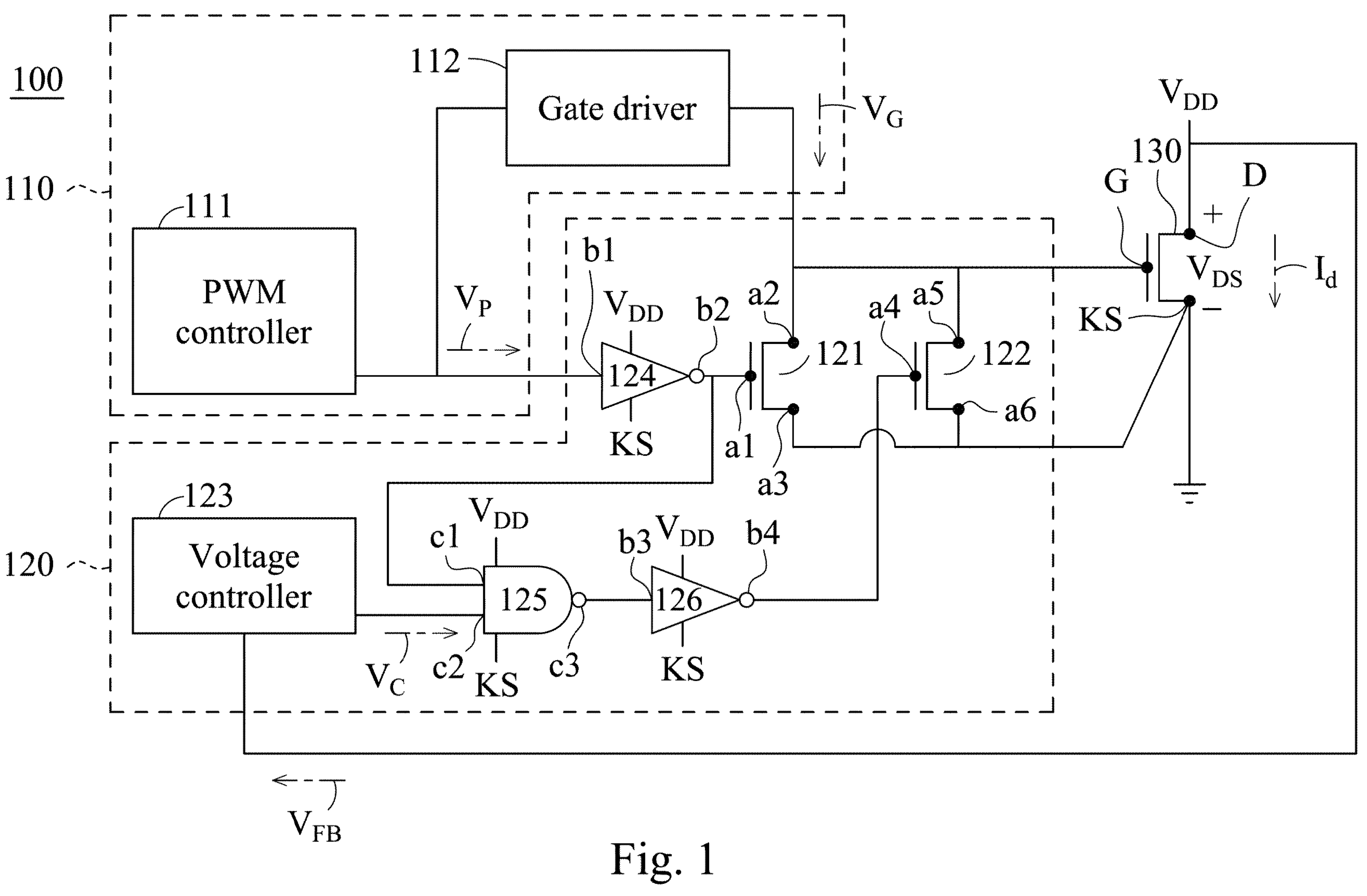
FIG. 1 shows a circuit schematic diagram of a driving circuit for a power transistor according to a first example of a first embodiment of the present disclosure.

Please refer to FIG. 1. FIG. 1 shows a circuit schematic diagram of a driving circuit 100 for a power transistor (hereinafter referred to as "the driving circuit 100") according to a first example of a first embodiment of the present disclosure. As shown in FIG. 1, the driving circuit 100 includes a gate driving circuit 110, a controlling circuit 120 and a power transistor 130. The gate driving circuit 110 is configured to output a driving voltage signal $V_G$ and a pulse width modulation (PWM) signal $V_P$. The controlling circuit 120 includes a first transistor 121, a second transistor 122 and a voltage controller 123. The voltage controller 123 is configured to output a controlling signal $V_C$. The first transistor 121 is coupled (directly connected) to the gate driving circuit 110 and selectively turned on or off according to the PWM signal $V_P$. The second transistor 122 is coupled (directly connected) to the gate driving circuit 110 and coupled (indirectly connected) to the voltage controller 123. The second transistor 122 is selectively turned on or off according to the PWM signal $V_P$ and the controlling signal $V_C$. The power transistor 130 is coupled (directly connected) to the gate driving circuit 110 and the controlling circuit 120, and is controlled by the driving voltage signal $V_G$. In response to determining that the first transistor 121 is turned on or both the first transistor 121 and the second transistor 122 are turned on, the driving voltage signal $V_G$ is pulled to a target voltage level. Thus, by configuring a gate terminal G of the power transistor 130 with the first transistor 121 and the second transistor 122, the driving circuit 100 of the present disclosure can use the first transistor 121 and the second transistor 122 to pull the driving voltage signal $V_G$ to the target voltage level (such as a high voltage level or a low voltage level), thereby improving the pull-up or pull-down capability of the gate driving circuit 110. Based on the driving voltage signal $V_G$ being pulled to the target voltage level, the power transistor 130 can be turned on or off quickly, thus shortening the overlap time of the transition of a voltage $V_{DS}$ and a current $I_d$ when the power transistor 130 is switched, so that the switching power losses can be reduced.

Specifically, the power transistor 130 can be a gallium nitride high electron mobility transistor (GaN HEMT). The gate driving circuit 110 can include a pulse width modulation (PWM) controller 111 and a gate driver 112. The PWM controller 111 is configured to generate the PWM signal $V_P$ and controls the power transistor 130 to be turned on or turned off via the PWM signal $V_P$. The gate driver 112 is electrically connected to the PWM controller 111, and converts (amplifies) the PWM signal $V_P$ into the driving voltage signal $V_G$. In FIG. 1, the gate driver 112 is a component external to the PWM controller 111, but in other embodiments the gate driver 112 can be a component internal to the PWM controller 111. The PWM controller 111 can be, but is not limited to, a central processing unit (CPU), an embedded controller (EC), a micro processing unit (MPU), a digital signal processor (DSP), an application-specific integrated circuit (ASIC), a system on a chip (SoC), or other computing processing components and their combinations. The first transistor 121 and the second transistor 122 of the controlling circuit 120 can be both an enhancement mode metal-oxide-semiconductor field effect transistor (MOSFET). The first transistor 121 includes a first gate terminal a1, a first drain terminal a2 and a first source terminal a3. The first gate terminal a1 is coupled to the PWM controller 111. The first drain terminal a2 is electrically connected to the gate driver 112 and the gate terminal G of the power transistor 130. The first source terminal a3 forms a kelvin connection with a source terminal KS of the power transistor 130. The second transistor 122 includes a second gate terminal a4, a second drain terminal a5 and a second source terminal a6. The second gate terminal a4 is coupled (indirectly connected) to the PWM controller 111 and the voltage controller 123. The second drain terminal a5 is electrically connected to the gate driver 112 and the gate terminal G of the power transistor 130. The second source terminal a6 forms the kelvin connection with the source terminal KS of the power transistor 130, and the source terminal KS can be a kelvin source. The main purpose of introducing the kelvin source into the packaging of the power transistor 130 is to optimize the driving behavior. When the power transistor 130 is turned on, the current $I_d$ having the high change rate generates a voltage disturbance on a stray inductance in the packaging. If the power transistor 130 is driven by using the conventional packaging method, the driving voltage signal $V_G$ is affected by the stray inductance, resulting in weakening of its driving capability, making the power transistor 130 unable to be turned on smoothly, and increasing the switching power losses.

In detail, the controlling circuit 120 can further include a first inverter 124, a NAND gate 125 and a second inverter 126, which are all coupled to a power supply terminal $V_{DD}$ and the source terminal KS of the power transistor 130. The first inverter 124 includes a first input terminal b1 and a first output terminal b2. The first input terminal b1 is electrically connected to the PWM controller 111 of the gate driving circuit 110. The first output terminal b2 is electrically connected to the first gate terminal a1 of the first transistor 121. The NAND gate 125 includes a first logic input terminal c1, a second logic input terminal c2 and a logic output terminal c3. The first logic input terminal c1 is electrically connected to the first output terminal b2 and the first gate terminal a1 of the first transistor 121. The second logic input terminal c2 is electrically connected to the voltage controller 123 and receives the controlling signal $V_C$. The second inverter 126 includes a second input terminal b3 and a second output terminal b4. The second input terminal b3 is electrically connected to the logic output terminal c3. The second output terminal b4 is electrically connected to the second gate terminal a4 of the second transistor 122. The gate driving circuit 110 and the controlling circuit 120 can be implemented by monolithic integration or heterogeneous integration technologies.

In the first example, the target voltage level is a low voltage level; in other words, the controlling circuit 120 is mainly used to enhance the pull-down capability of the gate driver 112, and pulls down the driving voltage signal $V_G$ to the low voltage level. Please continue to refer to Table 1. Table 1 is a truth table of the first inverter 124, the NAND gate 125 and the second inverter 126 in the controlling circuit 120. In Table 1, "b1" and "b2" are respectively an input of the first input terminal b1 and an output of the first output terminal b2 of the first inverter 124. "c1" and "c2" are respectively an input of the first logic input terminal c1 and an input of the second logic input terminal c2 of the NAND gate 125. "c3" is an output of the logic output terminal c3 of the NAND gate 125. "b3" and "b4" are respectively an input of the second input terminal b3 and an output of the second output terminal b4 of the second inverter 126.

TABLE 1

| | First inverter | | NAND gate | | | Second inverter | |
|---|---|---|---|---|---|---|---|
| | b1 | b2 | c1 | c2 | c3 | b3 | b4 |
| Situation 1 | 1 | 0 | 0 | 0 | 1 | 1 | 0 |
| Situation 2 | 1 | 0 | 0 | 1 | 1 | 1 | 0 |
| Situation 3 | 0 | 1 | 1 | 0 | 1 | 1 | 0 |
| Situation 4 | 0 | 1 | 1 | 1 | 0 | 0 | 1 |

In Table 1, when the PWM signal $V_P$ output by the PWM controller 111 is a high-level signal (1), that is, when the input of the first input terminal b1 is the high-level signal (1) and the output of the output terminal b2 is a low-level signal (0), the first transistor 121 and the second transistor 122 are both turned off. In particular, when the PWM signal $V_P$ output by the PWM controller 111 is the low-level signal (0), that is, when the input of the first input terminal b1 is the low-level signal (0) and the output of the first output terminal b2 is the high-level signal (1), the first transistor 121 is turned on, but whether the second transistor 122 is turned on depends on the controlling signal $V_C$ output by the voltage controller 123. For example, the controlling signal $V_C$ in Situation 3 is the low-level signal (0), that is, the input of the second logic input terminal c2 is 0, and at this moment, the output of the second output terminal b4 of the second inverter 126 is also the low-level signal (0), causing the second transistor 122 to be turned off. On the contrary, the controlling signal $V_C$ in Situation 4 is the high-level signal (1), that is, the input of the second logic input terminal c2 is 1, and at this moment, the output of the second output terminal b4 of the second inverter 126 is also the high-level signal (1), causing the second transistor 122 to be turned on.

Figure 2:
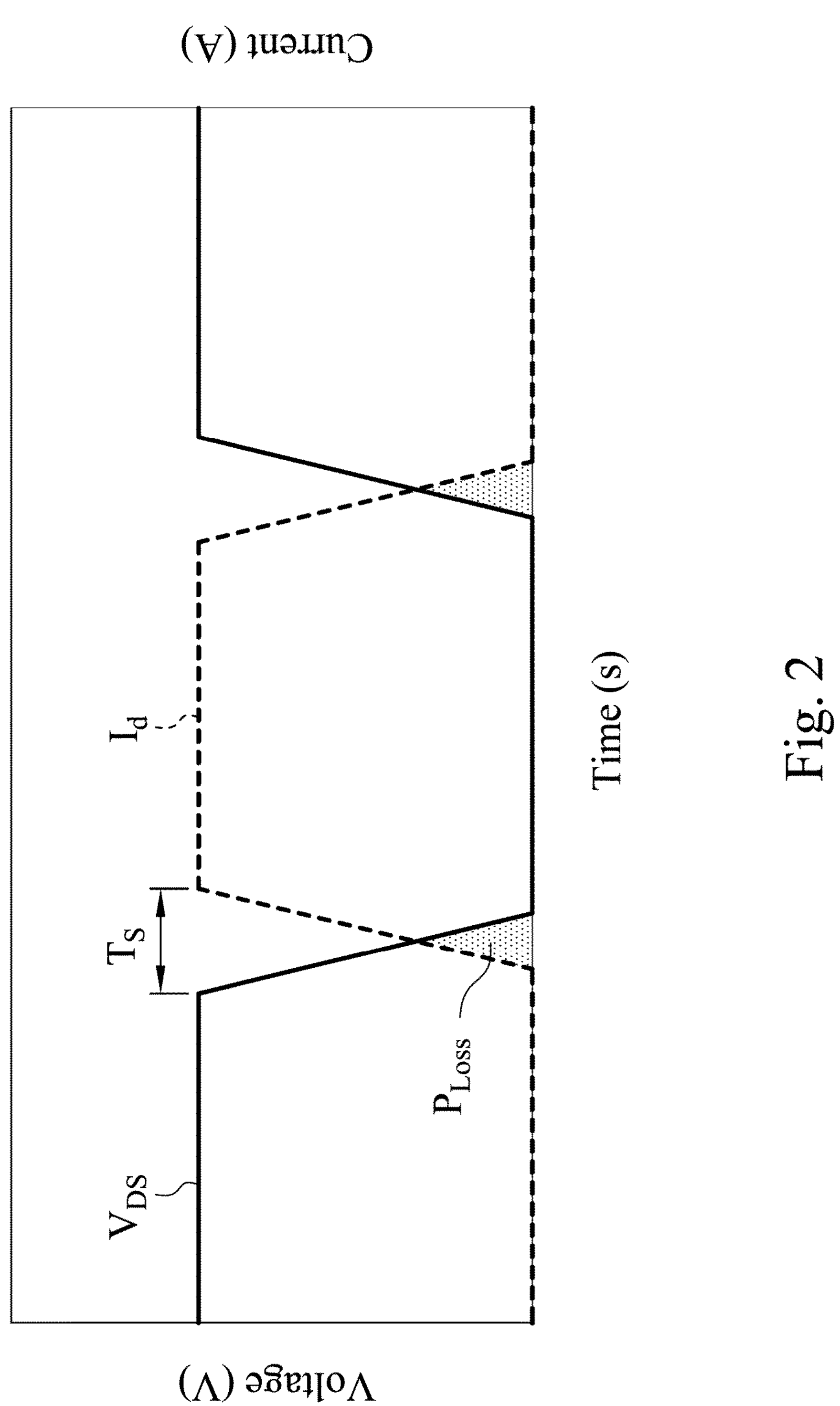
FIG. 2 shows a voltage-current waveform diagram of the power transistor in the driving circuit of FIG. 1 during switching.

Please refer to FIGS. 1, 2 and Table 1. FIG. 2 shows a voltage-current waveform diagram of the power transistor 130 in the driving circuit 100 of FIG. 1 during switching. When the output of the first output terminal b2 is the high-level signal (1), the first gate terminal a1 of the first transistor 121 receives the high-level signal (1), and the first transistor 121 is turned on. Based on the first source terminal a3 of the first transistor 121 being electrically connected to the source terminal KS and the source terminal KS being electrically connected to a ground terminal (its reference numeral is omitted), the driving voltage signal $V_G$ is pulled to the target voltage level (i.e., a low voltage level). Therefore, there is a switching time TS (shown in FIG. 2) during the process of switching the power transistor 130 from on to off. At the switching time TS, the gate terminal G of the power transistor 130 discharges rapidly, causing the voltage $V_{DS}$ to drop rapidly and the current $I_d$ to rise rapidly, thereby shortening the overlap time of the transition of the voltage $V_{DS}$ and the current $I_d$. The shortening of the overlap time corresponds to the reduction of the area of a switching power loss $P_{Loss}$ in FIG. 2. The switching power loss $P_{Loss}$ can be calculated by performing an integral approximation on an overlapping portion of a curve of the voltage $V_{DS}$ and a curve of the current $I_d$.

In addition, the voltage controller 123 is electrically connected to a drain terminal D of the power transistor 130. The voltage controller 123 captures a feedback voltage signal $V_{FB}$ from the power transistor 130, and determines whether a slope of the feedback voltage signal $V_{FB}$ is greater than a threshold value to generate a signal confirmation result. In response to determining that the signal confirmation result is "Yes", the controlling signal $V_C$ output by the voltage controller 123 is the high-level signal (1). In response to determining that the signal confirmation result is "No", the controlling signal $V_C$ output by the voltage controller 123 is the low-level signal (0). The voltage controller 123 can be, but is not limited to, a digital signal processor (DSP), a micro processing unit (MPU), a central processing unit (CPU), or other electronic processors.

In detail, the feedback voltage signal $V_{FB}$ includes a voltage value, and the voltage value is the voltage $V_{DS}$ of the power transistor 130 during switching. The memory inside the voltage controller 123 stores the threshold value, and the threshold value can be −5, but the present disclosure is not limited thereto. The voltage controller 123 determines whether the slope of the voltage $V_{DS}$ (i.e., a pull-down slew rate) is greater than −5. If the slope tends to be flat and the slope (e.g., −4) is greater than −5, the controlling signal $V_C$ output by the voltage controller 123 is the high-level signal (1), and the second transistor 122 is turned on, which improves the pull-down capability of the gate driving circuit 110 and reduces the switching power loss $P_{Loss}$ of the power transistor 130. On the contrary, if the slope is too steep and the slope (e.g., −6) is less than −5, the controlling signal $V_C$ output by the voltage controller 123 is the low-level signal (0), and the second transistor 122 is turned off, which reduces the pull-down capability of the gate driving circuit 110, thus avoiding electromagnetic interference (EMI) caused by switching too fast. Therefore, the voltage controller 123 of the present disclosure can control the opening and closing of the second transistor 122 according to the pull-down slew rate to adjust the pull-down capability appropriately.

Figure 3:
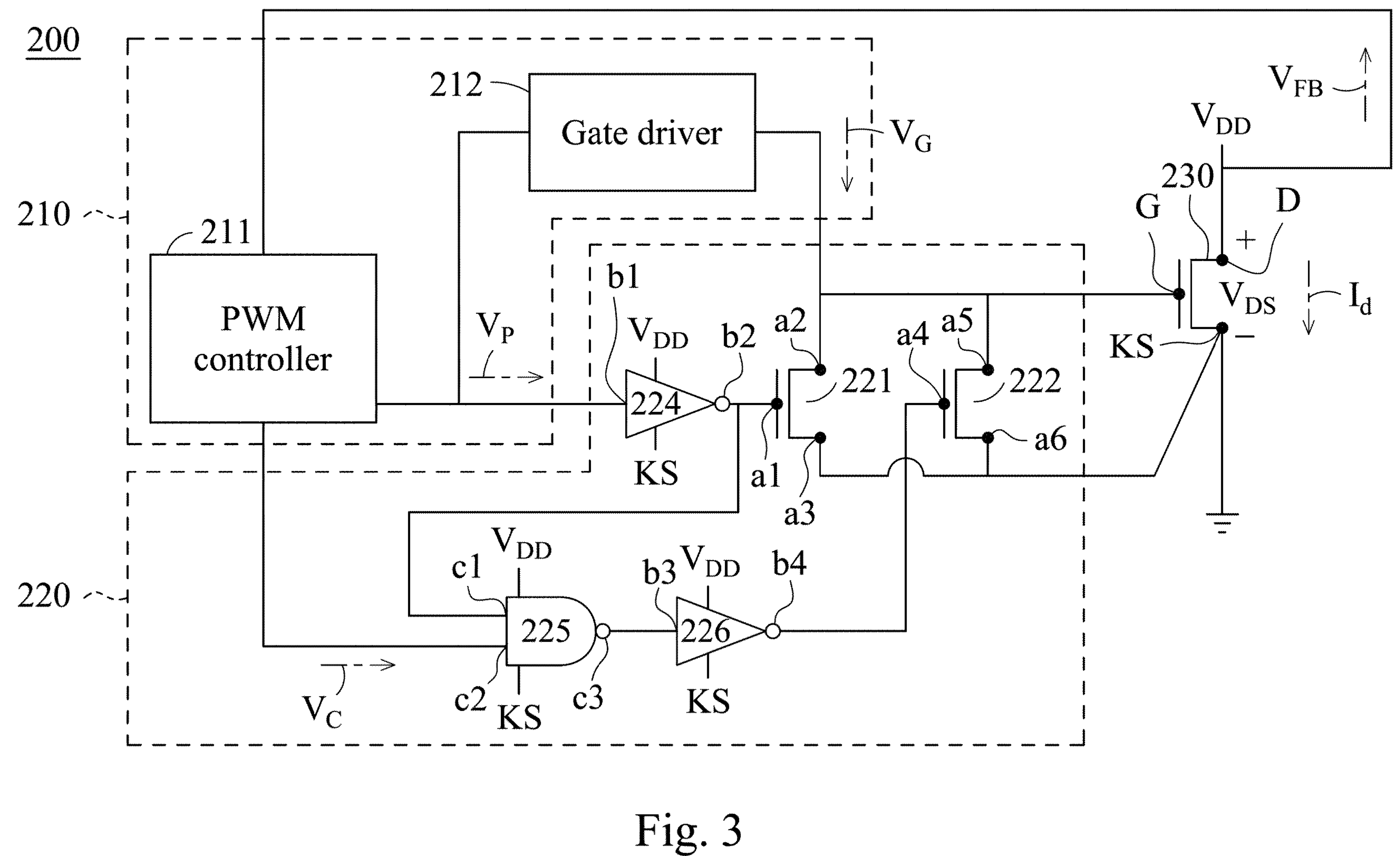
FIG. 3 shows a circuit schematic diagram of a driving circuit for a power transistor according to a second example of the first embodiment of the present disclosure.

Please refer to FIG. 3. FIG. 3 shows a circuit schematic diagram of a driving circuit 200 for a power transistor (hereinafter referred to as "the driving circuit 200") according to a second example of the first embodiment of the present disclosure. As shown in FIG. 3, the driving circuit 200 includes a gate driving circuit 210, a controlling circuit 220 and a power transistor 230. A PWM controller 211 of the gate driving circuit 210 is configured to output a PWM signal $V_P$ and a controlling signal $V_C$. A gate driver 212 of the gate driving circuit 210 is configured to output a driving voltage signal $V_G$. The controlling circuit 220 includes a first transistor 221, a second transistor 222, a first inverter 224, a NAND gate 225 and a second inverter 226. The first transistor 221 is coupled (directly connected) to the gate driving circuit 210 and selectively turned on or off according to the PWM signal $V_P$. The second transistor 222 is coupled (directly connected) to the gate driving circuit 210 and selectively turned on or off according to the PWM signal $V_P$ and the controlling signal $V_C$. The power transistor 230 is coupled (directly connected) to the gate driving circuit 210 and the controlling circuit 220, and is controlled by the driving voltage signal $V_G$. In response to determining that the first transistor 221 is turned on or both the first transistor 221 and the second transistor 222 are turned on, the driving voltage signal $V_G$ is pulled to a target voltage level. Therefore, the driving circuit 200 of the present disclosure uses the first transistor 221 and the second transistor 222 to pull the driving voltage signal $V_G$ to the target voltage level, thereby improving the pull-up or pull-down capability of the gate driving circuit 210, and shortening the overlap time of the transition of the voltage $V_{DS}$ and the current $I_d$ when the power transistor 230 is switched, so that the switching power losses can be reduced.

Specifically, the gate driving circuit 210, the controlling circuit 220 and the power transistor 230 of the second example are the same as the corresponding components of the first example, so the same internal structures and the operating functions are not be described again herein. The difference is that the controlling circuit 220 is not configured with the voltage controller 123 of the first example, but integrates its function into the PWM controller 211 of the gate driving circuit 210. Therefore, the second gate terminal a4 of the second transistor 222 is coupled to a control pin of the PWM controller 211 through the second inverter 226 and the NAND gate 225. The second logic input terminal c2 of the NAND gate 225 is electrically connected to the control pin of the PWM controller 211 and receives the controlling signal $V_C$.

Further, the PWM controller 211 of the gate driving circuit 210 is electrically connected to a drain terminal D of the power transistor 230. The PWM controller 211 captures a feedback voltage signal $V_{FB}$ from the power transistor 230 and determines whether a slope (i.e., a pull-down slew rate) of the feedback voltage signal $V_{FB}$ is greater than a threshold value (e.g., −5) to generate a signal confirmation result. In response to determining that the signal confirmation result is "Yes", the controlling signal $V_C$ output by the PWM controller 211 is the high-level signal (1). In response to determining that the signal confirmation result is "No", the controlling signal $V_C$ output by the PWM controller 211 is the low-level signal (0). Thus, the PWM controller 211 of the present disclosure can control the opening and closing of the second transistor 222 according to the pull-down slew rate to adjust the pull-down capability appropriately.

In other embodiments, the logic components inside the controlling circuit can be configured according to the application topology required by users, so that the controlling circuit can also improve the pull-up capability of the gate driving circuit, thereby shortening the overlap time of the transition of a voltage and a current when the power transistor is switched, so that the switching power losses can be reduced.

Figure 4:
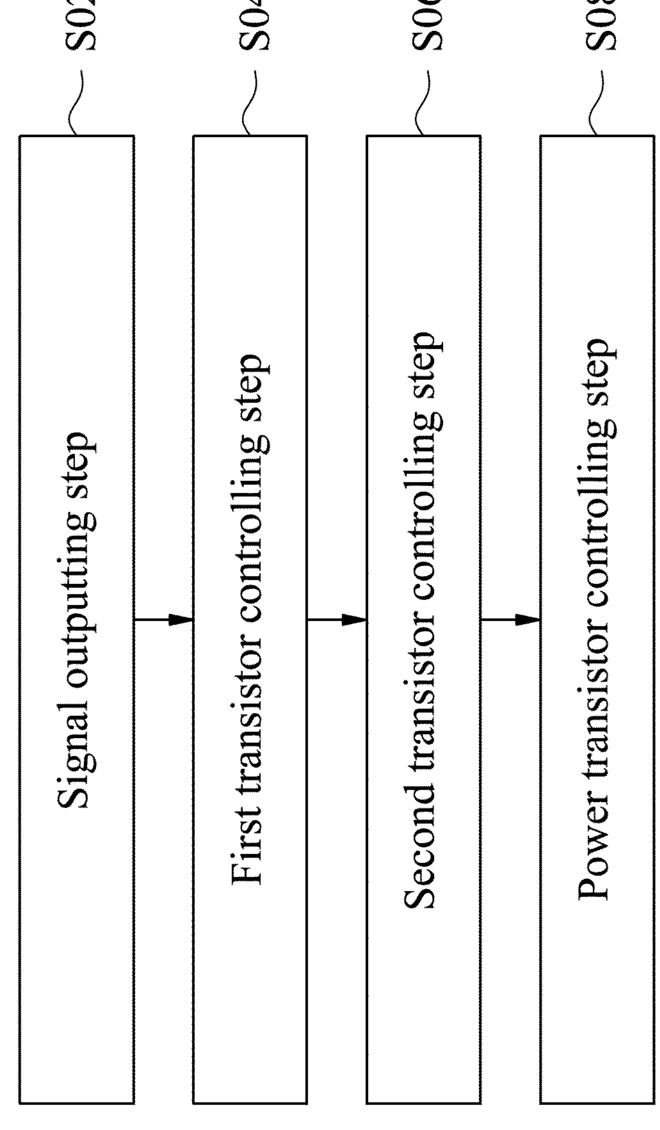
FIG. 4 shows a flow chart of a controlling method of a driving circuit for a power transistor according to a second embodiment of the present disclosure.

Please refer to FIGS. 1, 3 and 4. FIG. 4 shows a flow chart of a controlling method 300 of a driving circuit for a power transistor (hereinafter referred to as "the controlling method 300") according to a second embodiment of the present disclosure. As shown in FIG. 4, the controlling method 300 includes performing a signal outputting step S02, a first transistor controlling step S04, a second transistor controlling step S06 and a power transistor controlling step S08, and can be applied to the driving circuits 100, 200. The following paragraphs mainly take the application of the controlling method 300 to the driving circuit 100 as an example for description.

The signal outputting step S02 includes configuring the gate driving circuit 110 to output the driving voltage signal $V_G$ and the PWM signal $V_P$, and configuring the voltage controller 123 to output the controlling signal $V_C$. The first transistor controlling step S04 includes controlling the first transistor 121 of the controlling circuit 120 to selectively turn on or off according to the PWM signal $V_P$. The second transistor controlling step S06 includes controlling the second transistor 122 of the controlling circuit 120 to selectively turn on or off according to the PWM signal $V_P$ and the controlling signal $V_C$. The power transistor controlling step S08 includes controlling the power transistor 230 according to the driving voltage signal $V_G$. In response to determining that the first transistor 121 is turned on or both the first transistor 121 and the second transistor 122 are turned on, the driving voltage signal $V_G$ is pulled to the target voltage level. Therefore, the controlling method 300 of the present disclosure uses the first transistor 121 and the second transistor 122 to pull the driving voltage signal $V_G$ to the target voltage level, thereby improving the pull-up or pull-down capability of the gate driving circuit 110 to achieve the function of reducing the switching power losses.

In addition, if the controlling method 300 is applied to the driving circuit 200, the signal outputting step S02 can further include configuring the gate driving circuit 210 to output the controlling signal $V_C$. The difference is that the controlling circuit 220 is not configured with the voltage controller 123 of the first example, but integrates its function into the PWM controller 211 of the gate driving circuit 210.

In summary, the present disclosure has the following advantages. First, the driving voltage signal is pulled to the target voltage level through the first transistor and the second transistor, thereby improving the pull-up or pull-down capability of the gate driving circuit for the power transistor to achieve the function of reducing the switching power losses. Second, the opening and closing of the second transistor is controlled according to the pull-down slew rate to adjust the pull-down capability appropriately so as to avoid EMI caused by switching too fast.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A driving circuit for a power transistor, the driving circuit comprising:
- a gate driving circuit configured to output a driving voltage signal and a pulse width modulation signal;
- a controlling circuit comprising:
  - a voltage controller configured to output a controlling signal;
  - a first transistor coupled to the gate driving circuit and selectively turned on or off according to the pulse width modulation signal; and
  - a second transistor coupled to the gate driving circuit and the voltage controller, and selectively turned on or off according to the pulse width modulation signal and the controlling signal;
- the power transistor coupled to the gate driving circuit and the controlling circuit, and controlled by the driving voltage signal;
- wherein in response to determining that the first transistor is turned on or both the first transistor and the second transistor are turned on, the driving voltage signal is pulled to a target voltage level;
- wherein the first transistor comprises:
  - a first gate terminal coupled to the gate driving circuit;
  - a first drain terminal electrically connected to the gate driving circuit and a gate terminal of the power transistor; and
  - a first source terminal forming a kelvin connection with a source terminal of the power transistor;
- wherein the second transistor comprises:
  - a second gate terminal coupled to the gate driving circuit and the voltage controller;
  - a second drain terminal electrically connected to the gate driving circuit and the gate terminal of the power transistor; and a second source terminal forming the kelvin connection with the source terminal of the power transistor.

2. The driving circuit of claim 1, wherein the gate driving circuit comprises:

a pulse width modulation controller configured to generate the pulse width modulation signal; and a gate driver electrically connected to the pulse width modulation controller and converting the pulse width modulation signal into the driving voltage signal.

3. The driving circuit of claim 1, wherein the controlling circuit further comprises:

a first inverter comprising:

a first input terminal electrically connected to the gate driving circuit; and a first output terminal electrically connected to the first transistor;

a NAND gate comprising:

a logic output terminal;

a first logic input terminal electrically connected to the first output terminal; and a second logic input terminal electrically connected to the voltage controller and receiving the controlling signal; and a second inverter comprising:

a second input terminal electrically connected to the logic output terminal; and a second output terminal electrically connected to the second transistor.

4. The driving circuit of claim 1, wherein the voltage controller captures a feedback voltage signal from the power transistor and determines whether a slope of the feedback voltage signal is greater than a threshold value to generate a signal confirmation result;

wherein in response to determining that the signal confirmation result is yes, the controlling signal is 1;

wherein in response to determining that the signal confirmation result is no, the controlling signal is 0.

5. The driving circuit of claim 1, wherein the first transistor and the second transistor are both an enhancement mode metal-oxide-semiconductor field effect transistor (MOSFET).

6. The driving circuit of claim 1, wherein the power transistor is a high electron mobility transistor (HEMT).

7. A driving circuit for a power transistor, the driving circuit comprising:

a gate driving circuit configured to output a driving voltage signal, a pulse width modulation signal and a controlling signal;

a controlling circuit comprising:

a first transistor coupled to the gate driving circuit and selectively turned on or off according to the pulse width modulation signal; and a second transistor coupled to the gate driving circuit and selectively turned on or off according to the pulse width modulation signal and the controlling signal;

the power transistor coupled to the gate driving circuit and the controlling circuit, and controlled by the driving voltage signal;

wherein in response to determining that the first transistor is turned on or both the first transistor and the second transistor are turned on, the driving voltage signal is pulled to a target voltage level;

wherein the first transistor comprises:

a first gate terminal coupled to the gate driving circuit;

a first drain terminal electrically connected to the gate driving circuit and a gate terminal of the power transistor; and a first source terminal forming a kelvin connection with a source terminal of the power transistor;

wherein the second transistor comprises:

a second gate terminal coupled to the gate driving circuit;

a second drain terminal electrically connected to the gate driving circuit and the gate terminal of the power transistor; and a second source terminal forming the kelvin connection with the source terminal of the power transistor.

8. The driving circuit of claim 7, wherein the gate driving circuit comprises:

a pulse width modulation controller configured to generate the pulse width modulation signal; and a gate driver electrically connected to the pulse width modulation controller and converting the pulse width modulation signal into the driving voltage signal.

9. The driving circuit of claim 7, wherein the controlling circuit further comprises:

a first inverter comprising:

a first input terminal electrically connected to the gate driving circuit; and a first output terminal electrically connected to the first transistor;

a NAND gate comprising:

a logic output terminal;

a first logic input terminal electrically connected to the first output terminal; and a second logic input terminal electrically connected to the gate driving circuit and receiving the controlling signal; and a second inverter comprising:

a second input terminal electrically connected to the logic output terminal; and a second output terminal electrically connected to the second transistor.

10. The driving circuit of claim 7, wherein the gate driving circuit captures a feedback voltage signal from the power transistor and determines whether a slope of the feedback voltage signal is greater than a threshold value to generate a signal confirmation result;

wherein in response to determining that the signal confirmation result is yes, the controlling signal is 1;

wherein in response to determining that the signal confirmation result is no, the controlling signal is 0.

11. The driving circuit of claim 7, wherein the first transistor and the second transistor are both an enhancement mode metal-oxide-semiconductor field effect transistor (MOSFET).

12. The driving circuit of claim 7, wherein the power transistor is a high electron mobility transistor (HEMT).

13. A controlling method of a driving circuit for a power transistor, the controlling method comprising:

a signal outputting step comprising:

configuring a gate driving circuit to output a driving voltage signal and a pulse width modulation signal; and configuring one of the gate driving circuit and a voltage controller to output a controlling signal;

a first transistor controlling step comprising controlling the first transistor to selectively turn on or off according to the pulse width modulation signal;

a second transistor controlling step comprising controlling the second transistor to selectively turn on or off according to the pulse width modulation signal and the controlling signal; and a power transistor controlling step comprising controlling the power transistor according to the driving voltage signal;

wherein in response to determining that the first transistor is turned on or both the first transistor and the second transistor are turned on, the driving voltage signal is pulled to a target voltage level;

wherein the first transistor comprises:

a first gate terminal coupled to the gate driving circuit;

a first drain terminal electrically connected to the gate driving circuit and a gate terminal of the power transistor; and a first source terminal forming a kelvin connection with a source terminal of the power transistor;

wherein the second transistor comprises:

a second gate terminal coupled to the one of the gate driving circuit and the voltage controller;

a second drain terminal electrically connected to the gate driving circuit and the gate terminal of the power transistor; and a second source terminal forming the kelvin connection with the source terminal of the power transistor.

14. The controlling method of claim 13, wherein the gate driving circuit comprises a pulse width modulation controller and a gate driver, and the signal outputting step further comprises:

configuring the pulse width modulation controller to generate the pulse width modulation signal; and configuring the gate driver to convert the pulse width modulation signal into the driving voltage signal.

15. The controlling method of claim 13, wherein in the signal outputting step, the one of the gate driving circuit and the voltage controller captures a feedback voltage signal from the power transistor and determines whether a slope of the feedback voltage signal is greater than a threshold to generate a signal confirmation result;

wherein in response to determining that the signal confirmation result is yes, the controlling signal is 1;

wherein in response to determining that the signal confirmation result is no, the controlling signal is 0.

16. The controlling method of claim 13, wherein the first transistor and the second transistor are both an enhancement mode metal-oxide-semiconductor field effect transistor (MOSFET).

17. The controlling method of claim 13, wherein the power transistor is a high electron mobility transistor (HEMT).

* * * * *